United States Patent [19]

Parrillo

[11] Patent Number: 4,762,802
[45] Date of Patent: Aug. 9, 1988

[54] METHOD FOR PREVENTING LATCHUP IN CMOS DEVICES

[75] Inventor: Louis C. Parrillo, Warren, N.J.

[73] Assignee: American Telephone and Telegraph Company AT&T, Bell Laboratories, Murray Hill, N.J.

[21] Appl. No.: 20,268

[22] Filed: Mar. 2, 1987

Related U.S. Application Data

[62] Division of Ser. No. 669,957, Nov. 9, 1984, abandoned.

[51] Int. Cl.[4] .................. H01L 21/265; H01L 21/38
[52] U.S. Cl. ........................ 437/24; 148/DIG. 82; 357/42; 357/91; 437/26; 437/29; 437/34
[58] Field of Search ................ 437/24, 29, 26, 34; 357/42, 91

[56] References Cited

U.S. PATENT DOCUMENTS

| | | | |
|---|---|---|---|
| 4,161,417 | 7/1979 | Yim et al. | 148/175 |
| 4,203,126 | 5/1980 | Yim et al. | 357/42 |
| 4,288,804 | 9/1981 | Kikuchi et al. | 357/42 |
| 4,302,875 | 12/1981 | Satou et al. | 29/571 |
| 4,318,750 | 3/1982 | Rai-Choudhury et al. | 148/1.5 |
| 4,320,409 | 3/1982 | Shoji | 357/42 |
| 4,327,368 | 4/1982 | Uchida | 357/42 |
| 4,506,436 | 3/1985 | Bakeman, Jr. et al. | 29/577 C |
| 4,567,713 | 5/1986 | Goodman et al. | 29/576 B |
| 4,619,033 | 10/1986 | Jastrzebski | 29/571 |
| 4,637,125 | 1/1987 | Iwasaki et al. | 29/571 |

OTHER PUBLICATIONS

Chao et al., IBM-TDB, 25 (1982), 3350.
"Electrical Properties of n-Type ... ", *Solid State Communications*, Nov. 1972, Y. Ohmura et al., pp. 263-265.
"Shallow Donor Formation ... ", *Phys. Stat. Sol. (a)*, vol. 15, 1973, Y. Ohmura et al., pp. 93-98.
"Latchup Control in CMOS ... ", *IEEE Trans. in Nuclear Science*, vol. NS-26, No. 6, Dec. 1979, A Ochoa et al., pp. 5056-5058.
Elimination of Latchup ... ", *IEDM* '80, Dec. 8-10, 1980, R. S. Payne et al., pp. 248-251.
"A Retrograde p-Well ... ", *IEEE Trans. on Electron Devices*, vol. ED-28, No. 10, Oct. 1981, R. D. Rung et al, pp. 1115-1119.
"Scaleable Retrograde P-Well ... ", *IEDM*'81, Dec. 7-9, 1981, S. R. Combs, pp. 346-349.
"Latchup Prevention Using an N-Well ... ", *IEEE Trans. on Electron Devices*, vol. ED-30, No. 10, Oct. 1983, P. J. Holly et al., pp. 1403-1405.
"Full Isolation Technology ... ", *IEDM* '81, Dec. 7-9, 1981, K. Imai et al., pp. 376-379.
"Characterization of CMOS Latchup", *IEDM* '82, Dec. 13-15, 1982, C. C. Huang et al., pp. 454-457.

*Primary Examiner*—Upendra Roy
*Attorney, Agent, or Firm*—Wendy W. Koba

[57] ABSTRACT

The present invention relates to a CMOS structure, and method for forming the same, which prevents latchup in MOS devices. The method is directed to the CMOS structure and functions to reduce the lateral resistance of the n-tub, where the presence of a large lateral resistance in the n-tubs of prior art arrangements, has been found to cause latchup. A retrograde n+ region is formed at a predetermined location in the n-tub using proton bombardment to increase the n-type donor concentration at this predetermined location in the n-tub and thus significantly reduce the lateral resistance associated with the n-tub. By reducing this resistance, the parasistic SCR action between the two types of bipolar devices will be lessened, since the lower resistance of the n-tub reduces the IR drop associated with the parasitic device located in the n-tub. A beam of hydrogen ions, or doubly ionized helium, is used as the proton source. The n+ region bmay be formed subsequent to the formation of the CMOS transistor diffusion regions, thus providing a method of decreasing the n-tub lateral resistance without interfering with the conventional CMOS processing steps.

9 Claims, 4 Drawing Sheets

METHOD FOR PREVENTING LATCHUP IN CMOS DEVICES

This is a division of application Ser. No. 669,957, filed Nov. 9, 1984, abandoned.

BACKGROUND OF THE INVENTION

1. Field of the Invention

The present invention relates to a CMOS structure and method utilizing decreased lateral resistance to prevent latchup and, more particularly, to a CMOS structure which utilizes proton bombardment to decrease the n-tub lateral resistivity which results in significantly reducing latchup.

2. Description of the Prior Art

A generic problem associated with CMOS structures has been their vulnerability to an undesirable conduction mechanism known as latchup. Latchup is a condition where high currents are conducted between VDD and VSS, which can cause the IC to cease functioning and even be destroyed. In particular, it is known that CMOS integrated circuits commonly contain parasitic PNPN structures which can give rise to the undesired latchup condition via an SCR action wherein the device is turned on by forward biasing one of the junctions in the PNPN structure. The device remains "on" even after the signal which produced the forward biasing is removed, and this can lead to destruction of the device by excessive current flow. The current gains of the parasitic npn and pnp transistors are the key parameters to control in avoiding latchup. If the product of the current gains of the two devices exceeds unity, the device can latch. Several techniques have been used to lower the current gains of the two devices, including gold doping and neutron irradiation to reduce the minority-carrier lifetimes. These and other methods of reducing latchup are discussed in the article "Latchup Control in CMOS Integrated Circuits", by A. Ochoa et al, appearing in *IEEE Transactions in Nuclear Science*, Vol. NS-26, No. 6, Dec. 1979 at pp. 5056-5058. These techniques are difficult to control and cause other deleterious effects in device operation (excess leakage, for example).

U.S. Pat. No. 4,203,126 issued to E. W. Yim et al on May 13, 1980, describes an alternative technique which utilizes a retarded electric field for reducing the current gain in the base region of the parasitic transistors in the CMOS device, thereby increasing the level of current required to produce latchup. The Yim et al method, however, requires additional masking steps early in the formation of the device which results in creating pattern shift and adding extra processing time and expenses to the final device. Another method of reducing latchup is disclosed in U.S. Pat. No. 4,327,368 issued to Y. Uchida on Apr. 27, 1982. In order to minimize latchup, a reverse-biased voltage is applied to the substrate via a metal plate which is connected between the bottom of the substrate and the power supply. Although this method is successful, its use in association with complementary MOS technology, which includes both n-and p-type devices in the same substrate, is suspect.

Recently, it has been found that the use of n-well epi-CMOS structures in place of the standard p-well reduces the latchup sensitivity. A discussion of this phenomenon can be found in the article entitled "Latchup Prevention Using an N-Well Epi-CMOS Process", by P. J. Holly et al., appearing in *IEEE Transactions on Electron Devices*, Vol. ED-30, No. 10, October 1983, at pp. 1403-1405. Although the use of an n-epi structure does reduce latchup, many circuits are formed using either a p-well or "twin" (both n and p) well structure, where latchup remains a major problem. Therefore, there is still a need for a method of reducing latchup in these conventional circuit structures.

SUMMARY OF THE INVENTION

The problem remaining in the prior art has been solved in accordance with the present invention, which relates to a CMOS structure with a buried n-type layer to prevent latchup, and more particularly, to a CMOS structure including n-tubs (wells) formed in a p-type substrate which utilizes proton bombardment to decrease the n-type lateral resisitivity by increasing the n-type concentration at a predetermined location in the n-tub, thus significantly reducing the latchup associated with the n-tub resistance.

It is an aspect of the present invention to provide a technique for increasing the doping within the n-tub which does not require additional masking steps and the process difficulties of forming a patterned buried layer prior to the growth of the epitaxial layer. In accordance with the present invention, proton bombardment is utilized immediately before metallization of the final device to place n-type donors at the bottom of the n-tub.

Another aspect of the invention is to reduce the gain associated with a parasitic vertical pnp transistor by using in proton bombardment to produce "defects" in the n- region which forms the base of this vertical transistor. By lowering the gain of this transistor, latchup is further reduced.

Other and further aspects of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
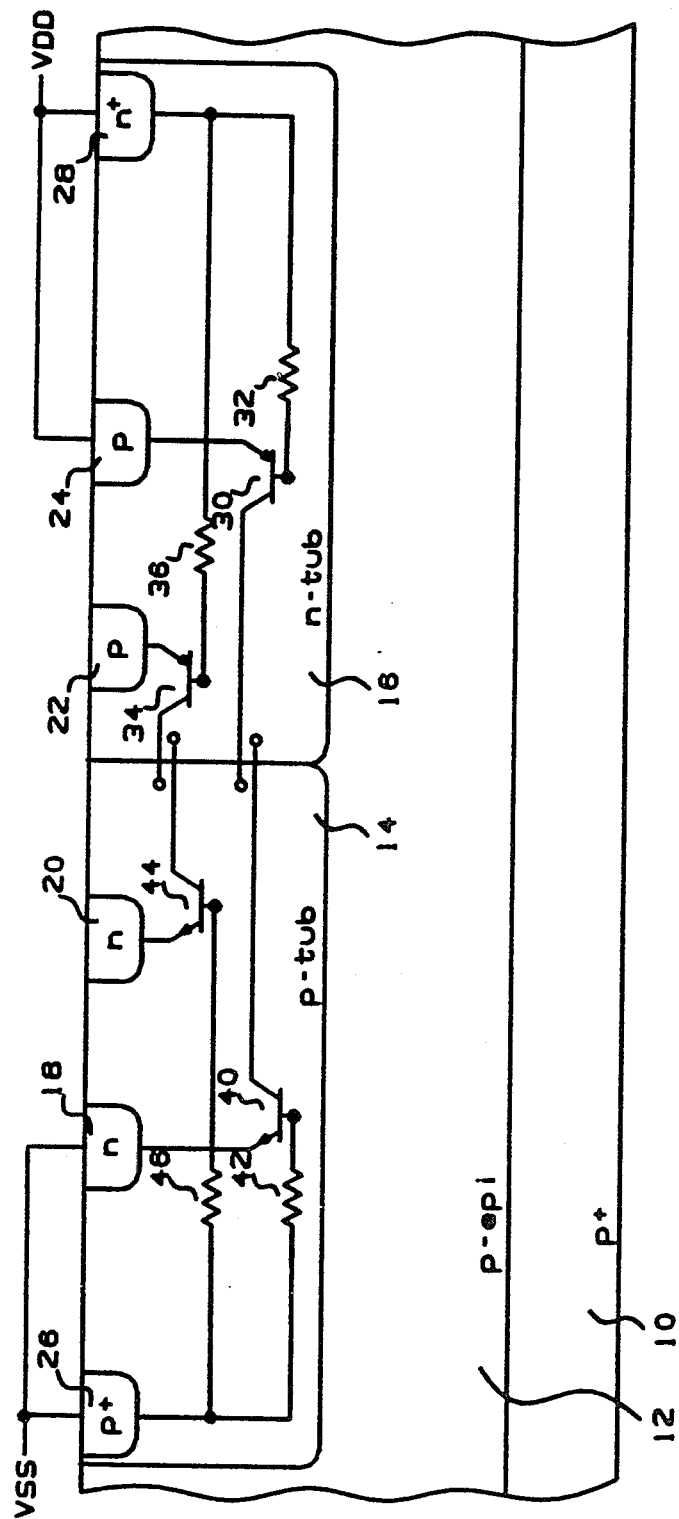
FIG. 1 illustrates a cross-section of an exemplary twin-tub CMOS structure indicating the location of the parasitic bipolar transistors which form the pnpn action of latchup.

As stated above, a generic problem associated with CMOS structures has been their vulnerability to latchup. FIG. 1, which illustrates a conventional twin-tub CMOS structure, shonws the parasitic bipolar devices which result form the CMOS manufacturing process. The structure of FIG. 1, formed using well-known techniques, uses a p-type starting material, or substrate, 10, upon which is grown a p-type epitaxial layer 12. It is to be understood that a gate oxide layer is subsequently grown and gate regions defined on p-epi layer 12. However, for the sake of simplicity, these regions are not illustrated in FIGS. 1-5. Using masking and diffusion steps, p-tub 14 and n-tub 16 are incorporated into p-epi layer 12. Shallow n-type diffusion contacts 18 and 20 are subsequently formed in p-tub 14 and, similarly, p-type contacts 22 and 24 are formed in n-tub 16. P-type diffusion 26 and n-type diffusion 28 are used to contact the power sources (VSS and VDD, respectively) to the device. A complete description of the twin-tub formation process may be found in U.S. Pat. No. 4,435,896 issued to L. C. Parrillo on Mar. 13, 1984.

As shown in FIG. 1, the process used for creating this CMOS structure results in the formation of a large plurality of parasitic bipolar devices, where for the sake of clarity only two transistors of each polarity are shown. Referring to FIG. 1, a pnp transistor 30 is formed between drain region 24, n-tub 16, and p-tub 14, where drain region 24 comprises the emitter, n-tub 16 the base, and p-tub 14 (as well as p-epi 12 and substrate 10) the collector of transistor 30. Additionally, a lateral resistor 32 is formed between drain region 24 and n-type contact diffusion 28. Similarly, a second pnp transistor 34 and resistor 36 exists between p-type contact 22 (emitter), n-tub 16 (base) and p-tub 14 (collector). A pair of lateral npn transistors is also formed, where these are located in p-tub 14. A first npn transistor 40 is formed from n-type source diffusion 18, p-tub 14, and n-tub 16, where source diffusion 18 forms the emitter of transistor 40, p-tub 14 is the base, and n-tub 16 is the collector. A resistor 42 also exists between the base of transistor 40 (p-tub 14) and p-type diffusion 26. N-type region 20, p-tub 14, and n-tub 16 act as the emitter, base and collector, respectively, of an additional npn parasitic transistor 44, where a resistor 46 exists between the base of transistor 44 (p-tub 14) and p-type diffusion 26. The collectors of each of these bipolar transistors feed each others' bases and together make up the above-described thyristor (p-n-p-n) device, as shown schematically in FIG. 2.

Figure 2:
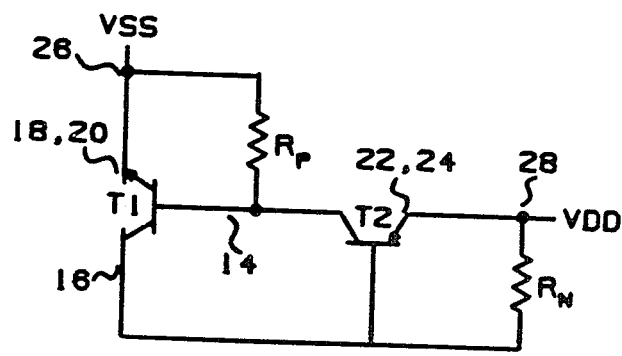
FIG. 2 is a schematic diagram illustrating the interconnection of the parasitic bipolar transistors shown in FIG. 1.

Referring to FIG. 2, pnp transistors 30 and 34 (of FIG. 1) are illustrated simply as $T_2$, and resistors 32 and 36 (of FIG. 1) are shown as $R_N$. Similarly, npn transistors 40 and 44 (of FIG. 1) are shown as $T_1$ and resistors 42 and 46 (of FIG. 1) are illustrated as $R_P$, where this simplified circuit is helpful in explaining the thyristor action which results in latchup. In particular, when the thyristor is appropriately biased, the collector current of pnp transistor $T_2$ supplies base current to npn transistor $T_1$, and vice versa in a positive-feedback arrangement. A sustained current can then exist between the positive and negative terminals of the transistor, where this sustained current is what is referred to as latchup. In particular, if the terminal associated with VSS is momentarily brought below the VSS potential by approximately 0.7 V, (through a spurious spike noise from electrostatic discharge, for example), then n+drain regions 18 and 20 (emitter of npn transistor $T_1$) inject electrons into p-tub 14 (the base of transistor $T_1$); the electrons reach n-tub 16 (collector of transistor $T_1$), where they drift out of the positive terminal 28. If this electron current is high enough, and if sufficient resistance $R_N$ exists between VDD contact 28 and p+ sources 22 and 24, an IR drop develops, which lowers the potential of n-tub 16 under p+regions 22 and 24 by approximately 0.7 V. This drop in potential causes holes to be emitted from p-type regions 22 and 24 (emitter of pnp transistor $T_2$) into n-tub 16 (base of transistor $T_2$); the holes reach p-tub 14 (collector of transistor $T_2$) and drift out of VSS terminal 26. If enough hole current exists in p-tub 14 and if sufficient resistance $R_P$ exists between p-type diffusion 26 and n+ source contact 18, an IR drop develops, which causes n+ source region 18 to inject electrons into p-tub 14. This electron current adds to the initial electron current and strengthens the positive feedback between pnp and npn transistors $T_1$ and $T_2$, respectively, which thus leads to the latchup condition. What makes the presence of latchup even more troublesome is the fact that the initial disturbance can be removed and the large latchup current will be self-sustained, unless power to the CMOS circuit is interrupted (i.e., either VDD or VSS disconnected).

An effective technique for reducing latchup is to reduce the resistances that shunt the emitter-base junctions of the parasitic bipolar transistors, illustrated as resistors $R_N$ and $R_p$ in FIG. 2. If these shunt resistors are made small enough, a sufficient IR drop, as discussed above, cannot be developed across them to forward-bias the emitter-base junctions, and the device will not latch. Therefore, in accordance with the present invention, a method of reducing shunt resistor $R_N$ located in n-tub 16 is disclosed. As will be discussed in greater detail hereinafter, an advantage of the present technique is that it can be performed immediately prior to the final metallization of the device, and, therefore, will not interfere with conventional prior art processing techniques.

Figure 3:
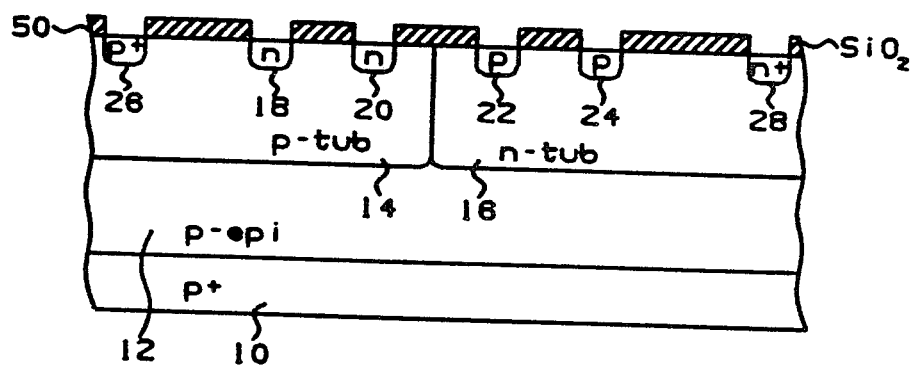
FIGS. 3-5 illustrate the process used to form the retrograde n+ region in accordance with the present invention.
Figure 4:
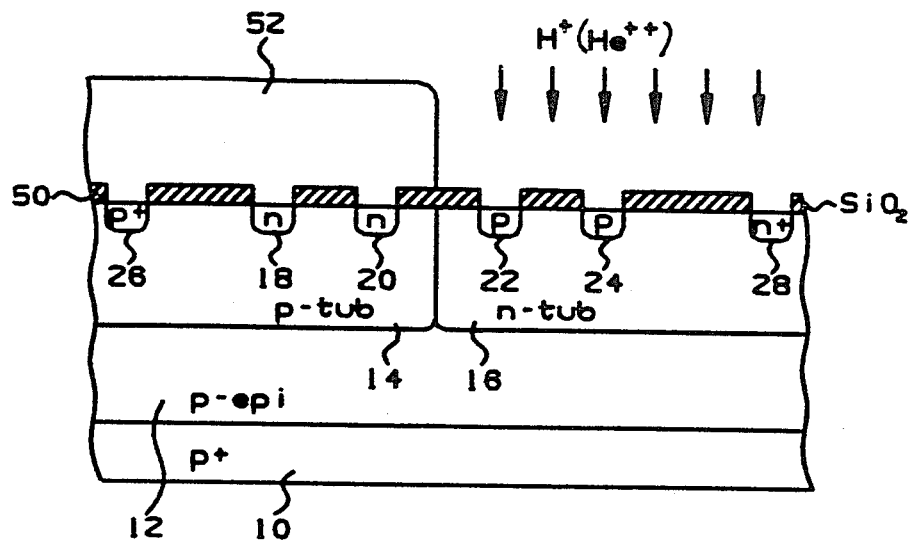
Figure 5:
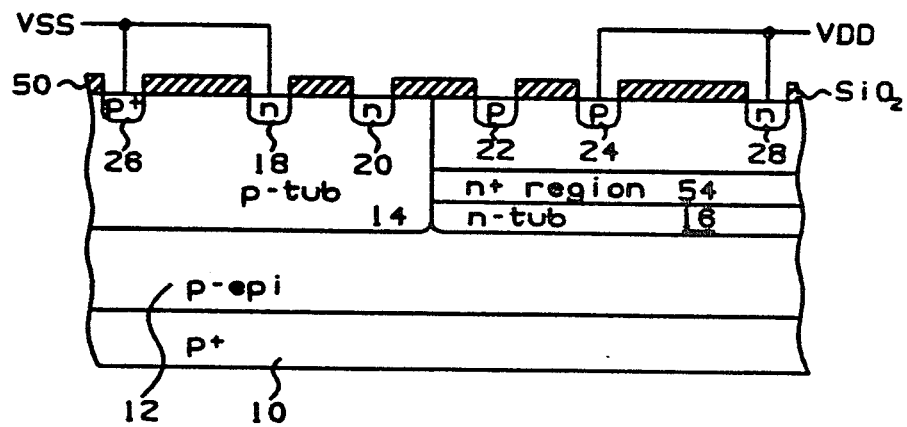

FIGS. 3-5 illustrate the processing steps needed to lower the resistance of n-tub 16 for preventing latchup in accordance with the present invention. Although FIGS. 3-5 illustrate a twin-tub CMOS structure, it is to be understood that the present invention is equally applicable to single tub arrangements, where the use of the twin-tub structure in the present description is for illustrative purposes only. Referring to FIG. 3, the starting point for the process of the present invention, for example, is a CMOS twin-tub structure which has been through every step in the fabrication process but the final metallization. FIG. 3 illustrates such an exemplary structure, which includes p+ substrate 10 and p-epi layer 12 covering substrate 10. P-tub 14 and n-tub 16 form the twin-tub structure, where n-type diffusions 18 and 20 and p-type diffusions 22 and 24 serve as the source/drain regions in p-tub 14 and n-tub 16, respectively. As stated above, p-type diffusions 26 and n-type diffusion 28 are used to bring the power supply voltages VSS and VDD, respectively, to the device. A patterned oxide layer 50 is deposited over this structure, where openings are formed for the final metal contacts.

Figure 6:
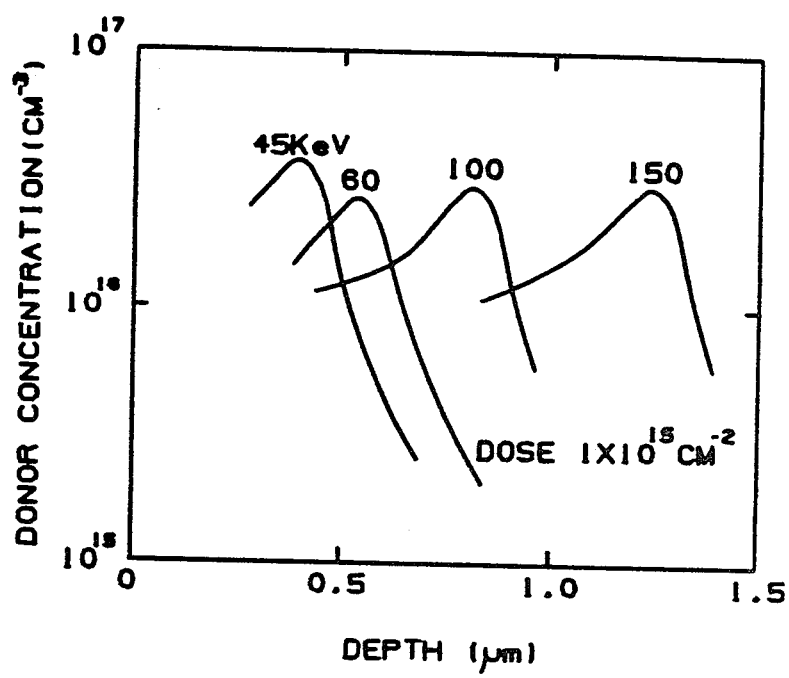
FIG. 6 illustrates exemplary proton-induced donor concentration profiles at varying depths.

As stated above, the present invention relates to a method of eliminating latchup by reducing the lateral resistance present in the n-tub. The resistance is lowered in accordance with the present invention by bombarding n-tub 16 with protons of a sufficient energy so as to create a highly n-doped region in the n-tub. This process is illustrated in FIG. 4. In order to assure that the protons are confined to the n-tub, a masking layer 52 is deposited which has been patterned to cover every region except for n-tub 16 (and any other n-tub present in the substrate). The proton implant can then be performed, where hydrogen ions (or, alternatively, doubly ionized He, He++) are used as the implant beam. It is known that by controlling the implant energy, the depth of the ion implant can be ascertained. FIG. 6, taken from an article entitled, "Full Isolation Technology by Porous Oxidized Silicon and its Applications to LSIs", by K. Imai et al, appearing in the 1981 *International Electron Devices Meeting* at pp. 376–379, contains a graph of proton-induced donor concentration versus implantation depth made for various implant energies to illustrate this point. For example, using a dose of $1 \times 10^{15} \text{cm}^{-2}$ hydrogen ions at an implant energy of 150 KeV, a donor concentration of $1 \times 10^{16} \text{cm}^{-3}$ will be formed at a depth of approximately 1.4 μm. In accordance with the present invention, it is necessary that the hydrogen ions be implanted below p-type regions 22 and 24 so as not to degrade the performance of the final PMOS device. Therefore, the location of the n-type implant can be controlled by referencing a graph similar to that of FIG. 6 to determine the proper implant energy and implant dose to yield the desired location of the implant.

The resultant structure formed in accordance with the present invention is illustrated in FIG. 5, where masking layer 52 has been removed. As shown, the proton bombardment with hydrogen ions (or helium ions) results in forming an n+ region 54, also referred to as a retrograde n-tub, at a location in n-tub 16 below p-type regions 22 and 24. By increasing the dopant concentraton in n+ region 54 to, for example, a value of $1 \times 10^{17} \text{cm}^{-3}$, the lateral resistance $R_N$ will be significantly reduced. Therefore, the IR drop across $R_N$ will likewise be reduced and the device will be less likely to latch. Additionally, the presence of n+ region 54 damages the base region of a vertical pnp transistor formed between p-type region 24, n-tub 16 and p-epi layer 12. This damage to the base of this parasitic transistor reduces the gain of the vertical transistor where this reduction in transistor gain also aids in preventing latchup.

It is to be noted that when the final device structure is annealed subsequent to the final metallization the position of n+ region 54 may change, driving the maximum concentration of n-type donors further down towards p-epi layer 12, where such a drive-in may be taken into consideration when determining the implant energy to use for the proton bombardment.

What is claimed is:

1. A method of preventing latchup in semiconductor devices comprising the steps of
   (a) providing a semiconductor substrate whose surface includes n-type wells, wherein each well exhibits a predetermined lateral resistance;
   (b) selectively bombarding the portion of said semiconductor substrate which includes the n-type wells with protons to form n+ regions within predetermined lateral portion of said n-type wells, wherein said n+ regions reduce the predetermined lateral resistance of said n-type wells to prevent latchup.

2. The method according to claim 1, wherein step (b) further contains the steps of
   (c) forming a layer of masking material over the surface of the semiconductor substrate;
   (d) patterning said masking layer with a mask which coincides with the locations of the n-type wells;
   (e) removing the portion of said masking layer which covers said n-type wells; and
   (f) directing the proton bombardment at the exposed n-type wells.

3. The method according to claim 1 wherein hydrogen ions are used as the source of the proton bombardment in step (b).

4. The method according to claim 1 wherein doubly ionized helium is used as the source of proton bombardment in step (b).

5. The method according to claim 3 wherein the hydrogen ions comprise a dose of approximately $1 \times 10^{15} \text{cm}^{-2}$ and are implanted with an energy of approximately 150eV.

6. A method of reducing latchup in a twin-tub CMOS structure, the structure comprising a first MOS device formed in a p-type conductivity tub and a second MOS device formed in an n-type conductivity tube contiguous to the p-type conductivity tub, the method comprising the step of:
   (a) bombarding the n-type conductivity tub with protons of sufficient dosage and energy to create an n+ region in the tub below the location of the second MOS device.

7. The method of claim 6 wherein hydrogen ions are used as the proton source.

8. The method of claim 6 wherein doubly-ionized helium is used as the proton source.

9. The method of claim 7 wherein the hydrogen ions comprise a dosage of $1 \times 10^{15} \text{cm}^{-2}$ and are implanted with an energy of approximately 150eV.

* * * * *

UNITED STATES PATENT AND TRADEMARK OFFICE
CERTIFICATE OF CORRECTION

PATENT NO. : 4,762,802

DATED : August 9, 1988

INVENTOR(S) : Louis C. Parrillo

It is certified that error appears in the above-identified patent and that said Letters Patent is hereby corrected as shown below:

In the Claims, Claim 6, Column 6, Line 36,

"the tub" should read

--the n-type conductivity tub--.

Signed and Sealed this

Twenty-seventh Day of December, 1988

Attest:

DONALD J. QUIGG

*Attesting Officer*  *Commissioner of Patents and Trademarks*